United States Patent
Chen

(10) Patent No.: US 6,858,897 B2
(45) Date of Patent: Feb. 22, 2005

(54) INDIVIDUALLY ADJUSTABLE BACK-BIAS TECHNIQUE

(75) Inventor: Thomas W. Chen, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/427,623

(22) Filed: Apr. 30, 2003

(65) Prior Publication Data

US 2004/0217372 A1 Nov. 4, 2004

(51) Int. Cl.$^7$ .............................................. H01L 29/76
(52) U.S. Cl. ..................................................... 257/341
(58) Field of Search ................................ 257/341, 368, 257/265, 392, 566

(56) References Cited

U.S. PATENT DOCUMENTS 5,844,425 A * 12/1998 Nguyen et al. ............... 326/58
6,326,832 B1 * 12/2001 Macaluso ..................... 327/534
RE38,222 E * 8/2003 Wu

OTHER PUBLICATIONS

H.C. Wann et al., "Channel Doping Engineering of MOSFET with Adaptable Threshold Voltage Using Body Effect for Low Voltage and Low Power Applications", 1995 International Symposium on VLSI Technology, Systems, and Applications, pp. 159–163, 1995.

T. Kuroda et al, "A 0.9V 150MHz 10–mW 2–D Discrete Cosine Transform Core Processor With Variable Threshold-Voltage Scheme", 1996 ISSCC Digest of Technical Papers, pp. 166–167, 1996.

M. Miyazaki et al, "1.2–GIPS/W Microprocessor Using Speed Adaptive Threshold–V ltage CMOS With Forward Bias", IEEE Journal of Solid–State Circuits, vol. 37, No. 2, pp. 210–217, F b. 2002.

M. Miyazaki et al, "A Delay Distribution Squeezing Scheme With Speed–Adaptive Threshold–Voltage CMOS (SA–Vt CMOS) for Low Voltage LSIs", Proceedings of 1998 International Symposium on Low Power Electronics and Design, pp. 48–53, Aug. 1998.

James Tschanz et al., "Adaptive body bias for reducing impacts of die–to–die within–die parameter variations on microprocessor requency and leakage", IEEE ISSCC 25.7, pp. 422–423, 478–479, Feb. 2002.

\* cited by examiner

Primary Examiner—Fetsum Abraham
(74) Attorney, Agent, or Firm—Leslie P. Gehman

(57) ABSTRACT

An individual-well adaptive method of body bias control that mitigates the effects of D2D and WD process variations is shown. It is assumed that p-type transistors are grouped in sections. The bodies of all the p-type transistors within a section are connected to a single n-well. This section size can be small enough to provide fine-granular adjustments to the circuit without having any impact on area overhead. With a small amount of additional circuitry and routing, individual well biases can be intelligently adjusted resulting in closely controlled chip power and performance. Experimental results show that binning yields as low as 17% can be improved to greater than 90% using the proposed method.

33 Claims, 4 Drawing Sheets

INDIVIDUALLY ADJUSTABLE BACK-BIAS TECHNIQUE

CROSS-REFERENCE TO RELATED APPLICATIONS

This application is related to application Ser. No. 10/427,617 also entitled, "An Individually Adjustable Back-Bias Technique," filed on or about the same date as the present application, and hereby incorporated herein by reference. application Ser. No. 10/427,617 discloses and claims an individually adjustable back-bias technique different from that claimed in the present application.

FIELD OF THE INVENTION

The present invention relates generally to the field of integrated circuits and more specifically to the field of minimization of the effects of die-to-die (D2D) and within-die (WD) process variations within integrated circuits.

BACKGROUND OF THE INVENTION

As modern CMOS technology is scaled down, the effects of die-to-die and within-die variations are becoming worse. Process variations can be categorized into four tiers, lot-to-lot variations, wafer-to-wafer variations, die-to-die variations, and within-die variations. For high performance VLSI chips, die-to-die and within-die variations have a significant impact on their performance and power consumption. Even though significant advances have been made to reduce process variations, silicon manufacturers have not been able to keep up with technology scaling. An existing statistical model, assuming a 3σ channel length deviation of 20% for the 50-nm technology generations, indicates that essentially a generation of performance gain can be lost due to systematic within-die variations.

Small variations in spatial dimensions are becoming large relative to the critical dimensions in manufacturing processes. These large relative variations cause wide distributions of circuit operating frequencies and power dissipation. The distributions in frequency and power determine the percentage of circuits or chips, that meet both a minimum frequency, $f_r$, and the power dissipation constraint, $P_r$. Given a fixed set of constraints, wider distributions make for lower binning yields after production.

Attempts have been made to adjust n-channel field effect transistor (nfet) and p-channel field effect transistor (pfet) body biases to affect the operating frequency and power consumption, thus, to improve product binning. Researchers beginning in 1995 have discussed the use of adaptive body bias (ABB) to reduce the transistor threshold voltage to retain device performance.

Recent work described an adaptive biasing method using an on-chip measuring circuit to determine the required back bias. Results suggest that, while the simplest implementation of ABB was effective in mitigating the effects of die-to-die (D2D) variation, its effect on within-die (WD) variation was limited. For this approach to be truly effective, $V_{nb}$ (the body voltage of the nfets) needs to be adjusted separately for each section of the circuit, which dictates using a triple-well process to generate both n-wells and p-wells. The effectiveness of this method is further limited by the size of the sections used. Increasing the effectiveness requires adding another power grid section, along with a replica critical path, phase detector, counter, and R–2R ladder digital-to-analog (D/A) converter. This proves to be enormously expensive in both die area and routing resources. Also, localized areas of high variations within a section are not addressed.

SUMMARY OF THE INVENTION

An individual-well adaptive method of body bias control (IW ABB) that mitigates the effects of D2D and WD process variations is shown. It is assumed that p-type transistors are grouped in sections. The bodies of all the p-type transistors within a section are connected to a single n-well. This section size can be small enough to provide fine-granular adjustments to the circuit without having any impact on area overhead. With a small amount of additional circuitry and routing, individual well biases can be intelligently adjusted resulting in closely controlled chip power and performance. Experimental results show that binning yields as low as 17% can be improved to greater than 90% using the proposed method.

Other aspects and advantages of the present invention will become apparent from the following detailed description, taken in conjunction with the accompanying drawings, illustrating by way of example the principles of the invention.

DETAILED DESCRIPTION

In an n-well or triple-well CMOS process, n-wells (pfet bodies) are normally connected directly to the power supply voltage, $V_{dd}$. Reducing the pfet body bias reduces their threshold voltage, $V_t$, making the pfets switch faster and increasing their leakage current. Since pfets are inherently slower than nfets, their switching speed is usually one of the limiting factors in overall circuit performance. Increasing pfet speed can provide a significant speed up of the entire circuit. However, instead of using a separate power supply and power grid to control $V_{pb}$ (the body voltage of the pfets) as previous researchers have done, one can use the capacitive coupling between drain and body of the pfets to provide $V_{pb}$ for an entire n-well as illustrated in FIG. 1.

Figure 1:
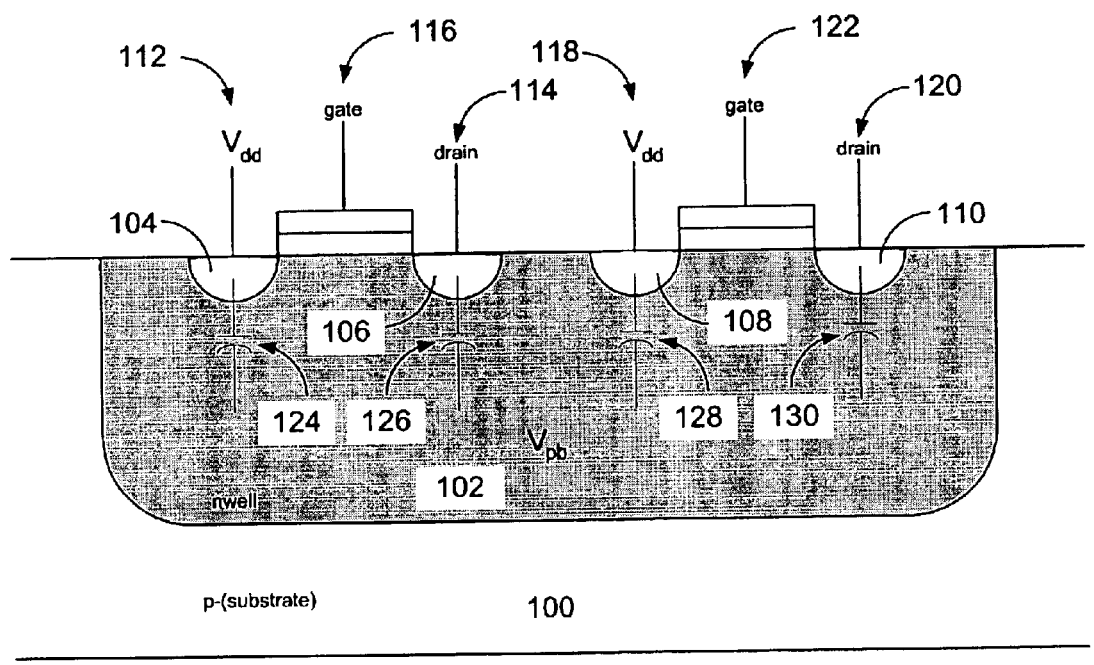
FIG. 1 is a cross-sectional view of an n-well including two pfets.

FIG. 1 is a cross-sectional view of an n-well including two pfets. In the example embodiment of the present invention shown in FIG. 1, an n-well 102 is created within a p-substrate 100. Two pfets are shown. A first pfet includes a first source 104 connected to a first source voltage $V_{dd}$ 112, a first drain 106 connected to a first drain voltage 114, and a first gate 116. A second pfet includes a second source 108 connected to a second source voltage $V_{dd}$ 118, a second drain 110 connected to a second drain voltage 120, and a second gate 122. A first source capacitance 124 is shown across the junction between the first source 104 and the n-well 102. A first drain capacitance 126 is shown across the junction between the first drain 106 and the n-well 102. A second source capacitance 128 is shown across the junction between the second source 108 and the n-well 102. A second drain capacitance 130 is shown across the junction between the second drain 110 and the n-well 102.

By disconnecting the n-well from $V_{dd}$ and allowing it to be regulated through these well-to-drain/source capacitors, the body voltage of all the pfets in the n-well will be determined collectively by their collective drain voltage. Assuming an n-well does not contain completely non-inverting logic (i.e., a significant number of pfets in each n-well are conducting at any time), $V_{pb}$ will always be maintained as a voltage somewhat below that of $V_{dd}$.

The thought of letting the well voltages self-regulate by disconnecting them from any active bias voltage may sound dangerous at first. To better understand the impact of such a configuration, one needs to understand the behavior of the floating bodies during switching events in terms of the performance gain achieved, added power consumption, and circuit reliability.

Figure 2:
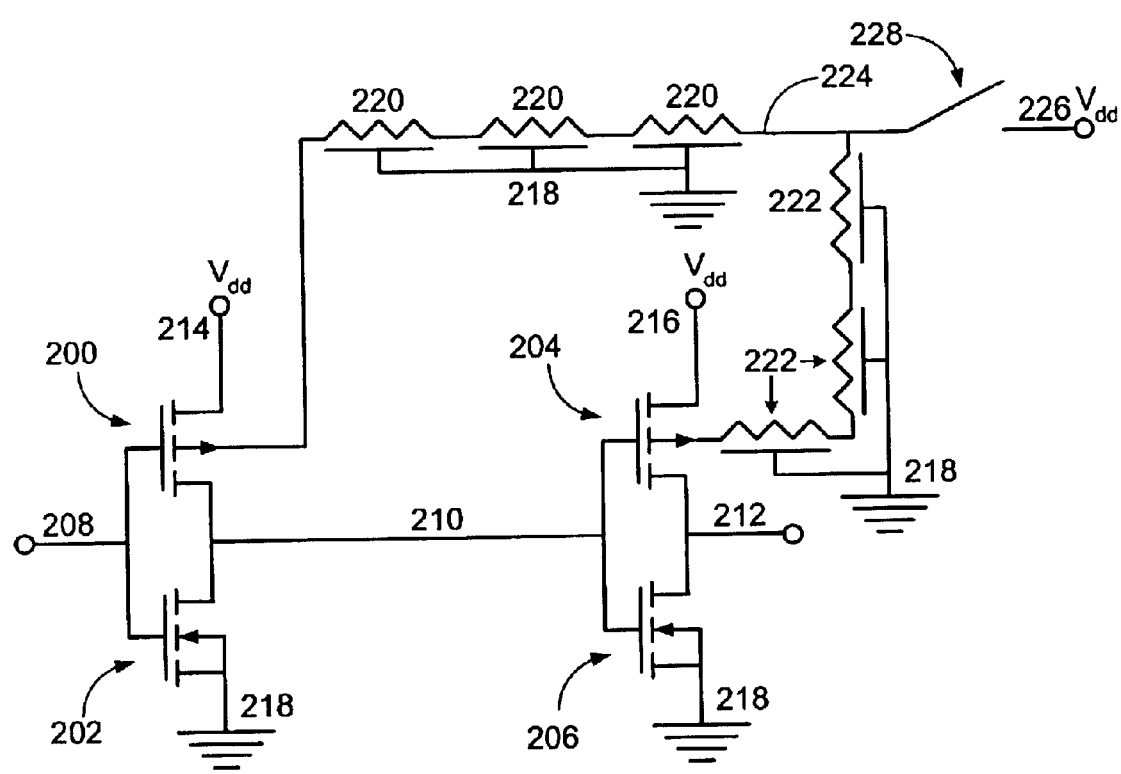
FIG. 2 is a schematic of an example embodiment of a back-bias circuit according to the present invention.

FIG. 2 is a schematic of an example embodiment of a back-bias circuit according to the present invention. A first inverter comprising a first pfet 200 and a first nfet 202, is created by connecting the drains of the first pfet 200 and first nfet 202 together, forming a first output node 210. The source of the first pfet 200 is connected to $V_{dd}$ 214, and the source of the first nfet 202 is connected to ground 218. The gates of the first pfet 200 and first nfet 202 are connected together, forming a first input 208. The n-well 224 may be biased to either $V_{dd}$ 226 or left floating, as determined by a shift register output, represented in this schematic as a switch 228 that either connects the n-well 224 to $V_{dd}$ 226 or leaves the n-well 224 floating. Those of skill in the art will recognize that this switch 228 may be implemented in a variety of ways, such as a 2:1 multiplexer, within the scope of the present invention. The parasitic resistors and capacitors between the n-well 224 and the first pfet 200 are represented by three RC models 220, connected between the body of the first pfet 200, ground 218, and the n-well 224.

A second inverter comprising a second pfet 204 and a second nfet 206, is created by connecting the drains of the second pfet 204 and second nfet 206 together, forming a second output node 212. The source of the second pfet 204 is connected to $V_{dd}$ 216, and the source of the second nfet 206 is connected to ground 218. The gates of the second pfet 204 and second nfet 206 are connected together, and also connected to the first output 210. The parasitic resistors and capacitors between the n-well 224 and the second pfet 204 are represented by three RC models 222, connected between the body of the second pfet 204, ground 218, and the n-well 224.

The bodies of both pfets in the circuit are connected to the same n-well. The distributed RC trees from the bodies to the $V_{dd}$ contact in FIG. 2 model the parasitics within the well and between the well and the substrate. Furthermore, the bias voltage of the n-well, if left floating, is influenced by the relative size of the pfets that are always switching in the opposite direction. By varying the size of these two pfets, simulations of this circuit can demonstrate: (1) the amount of body bounce and its relationship with the relative sizes of transistors that switch in the opposite direction, and (2) the impact of body bounce on overall gate delay.

Using a 0.1 μm CMOS process and by propagating a switching event through the inverter chain while sweeping the width of the pfets in the inverters independently, one can look at their body bounce and the delay through the chain as a function of the individual inverter widths. This is equivalent to sweeping the number of transistors in the n-well that switch in each direction. Note that sweeping the width of each of the inverters causes the well parasitics to be changed, and such changes are automatically incorporated in the netlist during simulation. There is an increase of about 40 mV in body bounce when the n-well is floating as apposed to that of a normally biased n-well. This should not be of enormous concern in terms of reliability. Floating pfet bodies is not a significant concern to reliability compared to that of the normally forward biased wells. The floating well, however, does not require an additional power grid for the bias distribution. Any n-well can be controlled to be floating or connected to an active bias voltage. Such control requires only one scan latch as shown by the switch 228 in FIG. 2. Further, to align the body bounce for floating wells, one can group the transistors and gates into a single well in such a way that the ratio of the total transistor sizes for switching in one direction versus the other direction is balanced. A ratio less than 2:1 or 3:1 is probably sufficient.

Since floating wells can only increase power, $P_{op}$ (due to increased leakage current), changing the biasing of connected wells is needed in order to reduce overall power dissipation. This can be done in both a single and triple-well process in three ways: (1) the voltage of connected p-wells (substrate in an n-well process) can be lowered, (2) the voltage of connected n-wells can be increased, or (3) both.

During circuit testing the operating frequency, $f_{op}$, and power, $P_{op}$, measurements used to bin the chip can first be used to control well connections (i.e., floating or biasing). In order to improve the binning yield, one needs to move the chip into an acceptable region where $f_{op}$ is greater than or equal to $f_t$ and $P_{op}$ is less than or equal to $P_{max}$, where $f_t$ is target frequency and $P_{max}$ is maximum power. Even for the relatively easy case of allowing floating n-wells and p-well biasing, the search space is enormous. For a circuit with n n-wells, there are $2^n$ possible configurations of floating n-wells. Combining this with the range of allowable p-well biases (based on a finite power supply resolution and range) makes an exhaustive search infeasible. However, determining which wells to float can be intelligently done with a genetic method. Each well is assigned to a single bit in a binary chromosome, and the genetic method searches for good combinations of floating and connected wells based on an objective function using $f_{op}$, $P_{op}$, $f_t$, and $P_t$.

Figure 3:
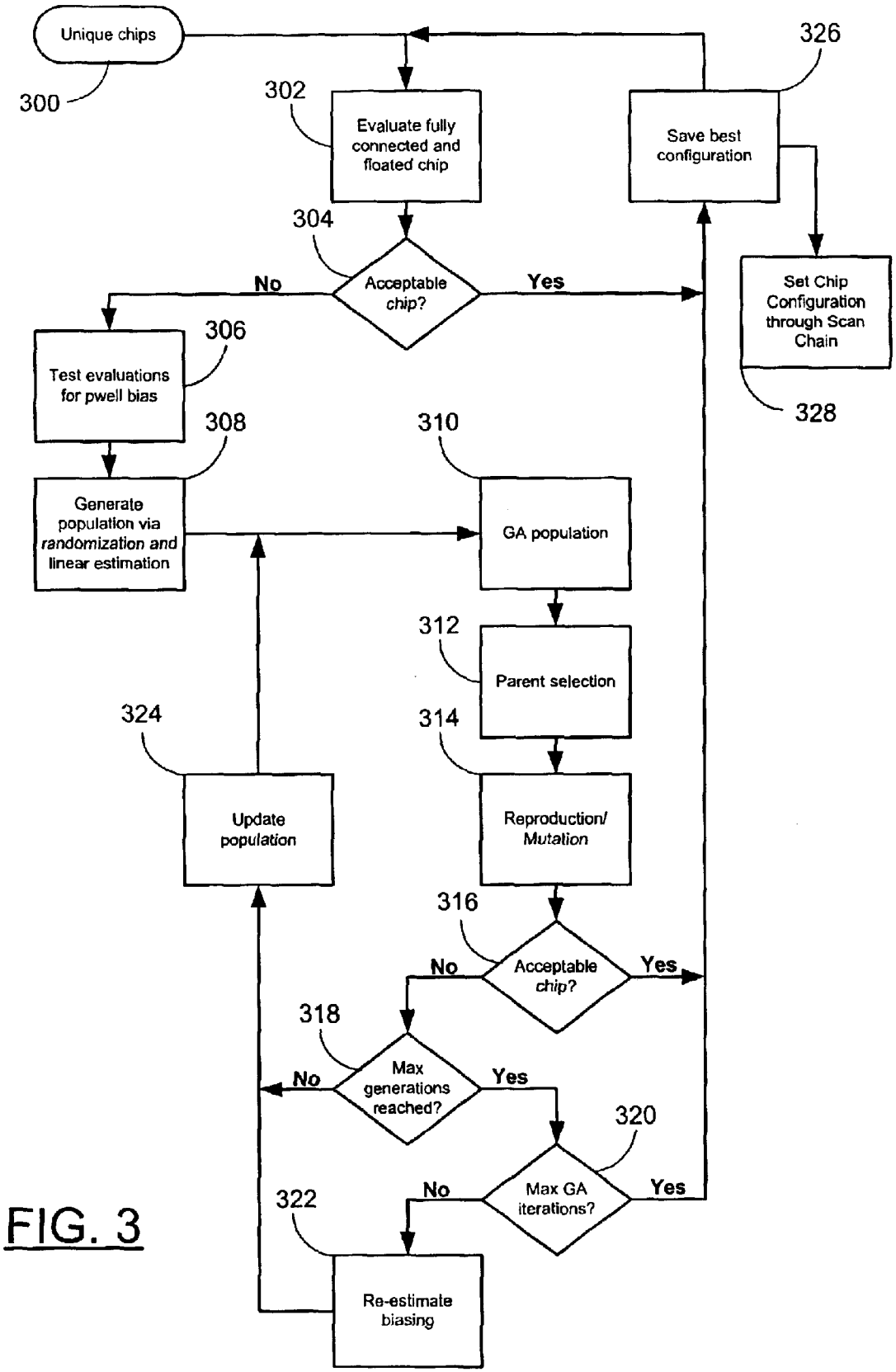
FIG. 3 is a flowchart of an example embodiment of the intelligent adaptive body-biasing algorithm according to the present invention.

FIG. 3 is a flowchart of an example embodiment of the Individual Well Adaptive Body Bias (IW ABB) method according to the present invention. Given a set of chips with process variations 300, IW ABB optimizes each chip based on its specific variations. In a step 302, if the given chip has n n-wells, IW ABB is run with an n-bit chromosome where each bit represents a single n-well. Initially, each chip is evaluated twice: once with all n-wells connected to $V_{dd}$ and once with all n-wells floating. In a decision step 304, if either of these configurations is acceptable, it is saved in a step 326, and the next chip is started. If an acceptable configuration is not found in the initial tests, in a step 306, an evaluation is run to determine the effectiveness of substrate biasing. Using these three evaluations the $\Delta P_{op}/\Delta f_{op}$ slope can be determined for both n-well floating and substrate biasing. In a step 308, using a simple linear estimate of the number of floating n-wells and the amount of substrate bias, a random population of chromosomes is generated and evaluated. In a step 310, basic Genitor-style genetic algorithm is run with this initial population. In a step 312, tournament selection is used to select two parent chromosomes from the population. In a step 314, these two parents beget one child chromosome via the reproduction function. The child's floating n-wells are generated by favoring the more fit parent in a HUX-style crossover. The child substrate bias is determined by the average of the parental substrate biasing. The child is then mutated both randomly and based on the average of the two parents. If the average $P_{op}$ of the parents is greater than $P_t$, a decrease in substrate bias is favored. If the average $f_{op}$ of the parents is less than $f_t$, the number of floating n-wells is at least the average number of floating parental n-wells. If the average $f_{op}$ of the parents is greater than $f_t$, the number of floating n-wells is at most the average number of floating parental n-wells. This sort of directed mutation is not true to the nature of genetic methods, but helps improve the speed of convergence. In a decision step 316, the child is then evaluated. If it is not acceptable, in a decision step 318, if the maximum number of generations has not been reached, then, in a step 324, the population is updated by replacing the least fit chromosome with the child. The next generation of the genetic algorithm then starts in step 310. If the maximum number of generations have been completed, and, in a decision step 320, the maximum number of Genitor-style genetic algorithm iterations have not been reached, then in a step 322 all of the substrate biases are updated based on a linear estimation. The population is updated in step 324, and the genetic algorithm is then restarted in step 310. At the end of the genetic algorithm iterations as determined by decision step 320, the best chromosome is recorded in a step 326. In a step 328, the best chromosome is used to set the chip configuration through a scan chain.

Those of skill in the art will be familiar with the standard genetic algorithm used in this example embodiment of the present invention. More details on genetic algorithms may be found in David Goldberg, *Genetic Algorithms*, Addison-Wesley, 1989.

Figure 4:
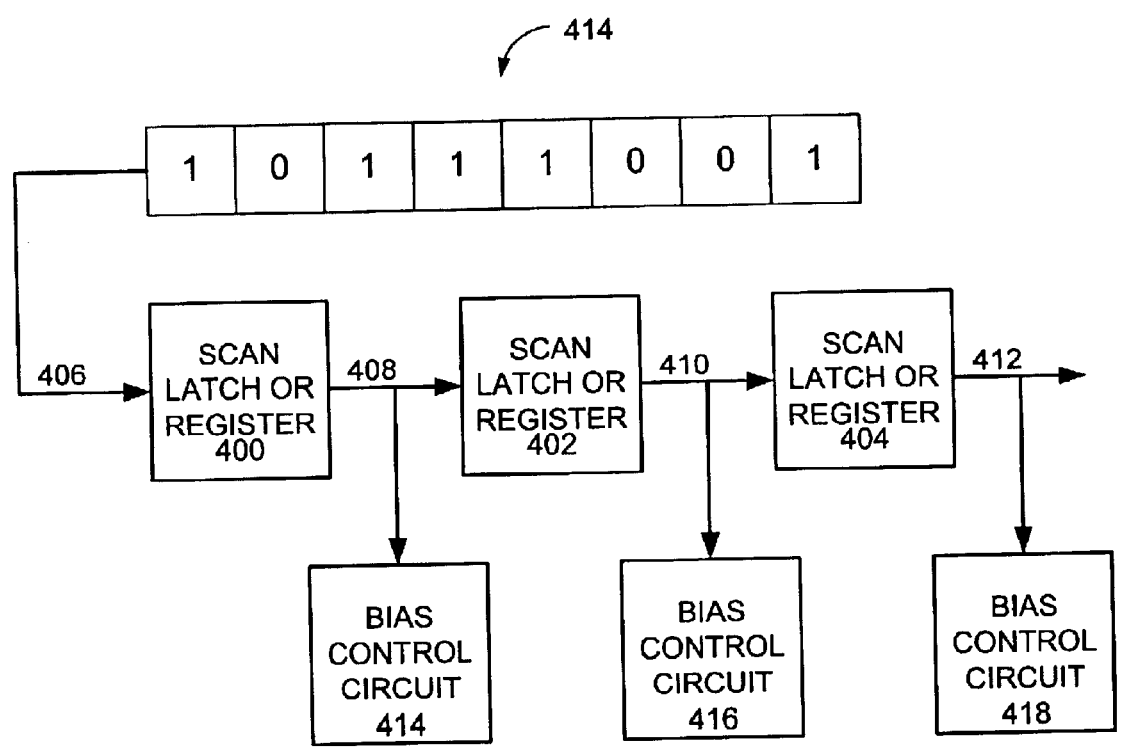
FIG. 4 is a block diagram of an example embodiment of the present invention showing the loading of the best chromosome into the scan chain as shown in step 328 in FIG. 3.

FIG. 4 is a block diagram of an example embodiment of the present invention showing the loading of the best chromosome into the scan chain as shown in step 328 in FIG. 3. A scan chain comprising a first scan latch or scan register 400, a second scan latch or scan register 402, and a third scan latch or scan register 404 is shown. Those of skill in the art will recognize that full master/slave scan registers are not required. Scan latches, shift registers, and other equivalent circuits outputting a control line will also work within the scope of the present invention. The output 408 of the first scan register 400 is connected to the input of the second scan register and the switch control line of a first bias control circuit 414. The output 410 of the second scan register 402 is connected to the input of the third scan register 404 and the switch control line of a second bias control circuit 416. The output 412 of the third scan register 404 is connected to the switch control line of a third bias control circuit 418. The scan chain is set through the input 406 of the first scan register 400 with the best chromosome for the chip as determined using the method shown in FIG. 3. Those of skill in the art will recognize that while three scan registers (or scan latches) and an 8-bit chromosome are shown in this example embodiment of the present invention, the scan chain and chromosome may be any length desired within the scope of the present invention. Typically each n-well on the chip will include one bias control circuit, controlled by a single bit in the scan chain, and the chromosome will be matched in size to the scan chain. Also, note that in some embodiments of the present invention, it may be beneficial to use more than one scan chain, where each scan chain sets a subset of all of the bias control circuits.

The foregoing description of the present invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit, comprising:

an n-well;

a first p-channel transistor within said n-well, wherein said n-well, forms the body of said first p-channel transistor; and a switch, wherein said switch, when closed, connects a power supply to said n-well, and when open, disconnects a power supply from said n-well allowing said n-well to float, wherein said switch is a second p-channel transistor with a source connected to said n-well, a drain connected to the power supply, and a gate connected to the output of a scan register.

2. The integrated circuit of claim 1, wherein the second p-channel transistor is located within said n-well.

3. An integrated circuit comprising:

an n-well;

a first p-channel transistor within said n-well, wherein said n-well forms the body of said first p-channel transistor; and a switch, wherein said switch, when closed, connects a power supply to said n-well, and when open, disconnects a power supply from said n-well allowing said n-well to float, wherein said switch is a second p-channel transistor with a drain connected to said n-well, a source connected to the power supply, and a gate connected to the output of a scan register.

4. The integrated circuit of claim 3, wherein the second p-channel transistor is located within said n-well.

5. An integrated circuit, comprising:

an n-well;

a first p-channel transistor within said n-well, wherein said n-well forms the body of said first p-channel transistor; and a switch, wherein said switch, when closeed, connects a power supply to said n-well, and when open, disconnects a power supply from n-well allowing said n-well to float, wherein said switch is controlled by the output of a scan register.

6. The integrated circuit of claim 5, wherein the scan register is part of a scan chain.

7. The integrated circuit of claim 6, wherein the outputs of the scan chain are set during manufacturing testing.

8. An integrated circuit, comprising:

an n-well;

a first p-channel transistor within said n-well, wherein said n-well forms the body of said first p-channel transistor; and a switch, wherein said switch, when closed, connects a power supply to said n-well, and when open, disconnects a power supply from said n-well allowing said n-well to float, wherein said switch is controlled by the output of a scan latch.

9. The integrated circuit of claim 8, wherein the scan latch is part of a scan chain.

10. The integrated circuit of claim 9, wherein the outputs of the scan chain are set during manufacturing testing.

11. An integrated circuit, comprising:
   an n-well;
   a first p-channel transistor within said n-well, wherein said n-well forms the body of said first p-channel transistor; and
   a switch, wherein said switch, when closed, connects a power supply to said n-well, and when open, disconnects a power supply from said n-well allowing said n-well to float,
   wherein said switch is controlled by the output of a shift register.

12. An integrated circuit, comprising:
   an n-well;
   a first p-channel transistor within said n-well, wherein said n-well forms the body of said first p-channel transistor; and
   a second p-channel transistor formed in said n-well, wherein said n-well forms a body of said second p-channel transistor; and
   a switch, wherein said switch, when closed, connects a power supply to said n-well, and when open, disconnects a power supply from said n-well allowing said n-well to float,
   wherein said switch is a third p-channel transistor with a source connected to said n-well, a drain connected to the power supply, and a gate connected to the output of a scan register.

13. The integrated circuit of claim 12, wherein the third p-channel transistor is located within said n-well.

14. The integrated circuit of claim 12, wherein the scan register is part of a scan chain.

15. The integrated circuit of claim 14, wherein the outputs of the scan chain are set during manufacturing testing.

16. An integrated circuit, comprising:
   an n-well;
   a first p-channel transistor within said n-well, wherein said n-well forms the body of said first p-channel transistor; and
   a second p-channel transistor formed in said n-well, wherein said n-well forms a body of said second p-channel transistor; and
   a switch, wherein said switch, when closed, connects a power supply to said n-well, and when open, disconnects a power supply from said n-well allowing said n-well to float,
   wherein said switch is a third p-channel transistor with a source connected to said n-well, a drain connected to the power supply, and a gate connected to the output of a scan latch.

17. The integrated circuit of claim 16, wherein the third p-channel transistor is located within said n-well.

18. The integrated circuit of claim 16, wherein the scan latch is part of a scan chain.

19. The integrated circuit of claim 18, wherein the outputs of the scan chain are set during manufacturing testing.

20. An integrated circuit, comprising:
   an n-well;
   a first p-channel transistor within said n-well, wherein said n-well forms the body of said first p-channel transistor; and
   a second p-channel transistor formed in said n-well, wherein said n-well forms a body of said second p-channel transistor; and
   a switch, wherein said switch, when closed, connects a power supply to said n-well, and when open, disconnects a power supply from said n-well allowing said n-well to float,
   wherein said switch is a third p-channel transistor with a source connected to said n-well, a drain connected to the power supply, and a gate connected to the output of a scan register.

21. The integrated circuit of claim 20, wherein the third p-channel transistor is located within said n-well.

22. An integrated circuit, comprising;
   an n-well;
   a first p-channel transistor within said n-well, wherein said n-well forms the body of said first p-channel transistor;
   a second p-channel transistor formed in said n-well, wherein said n-well forms a body of said second p-channel transistor; and
   a switch, wherein said switch, when closed, connects a power supply to said n-well, and when open, disconnects a power supply from said n-well allowing said n-well to float,
   wherein said switch is a third p-channel transistor with a drain connected to said n-well, a source connected to the power supply, and a gate connected to the output of a scan register.

23. The integrated circuit of claim 22, wherein the third p-channel transistor is located within said n-well.

24. The integrated circuit of claim 22, wherein the scan register is part of a scan chain.

25. The integrated circuit of claim 24, wherein the outputs of the scan chain are set during manufacturing testing.

26. An integrated circuit, comprising:
   an n-well;
   a first p-channel transistor within said n-well, wherein said n-well forms the body of said first p-channel transistor; and
   a second p-channel transistor formed in said n-well, wherein said n-well forms a body of said second p-channel transistor; and
   a switch, wherein said switch, when closed, connects a power supply to said n-well, and when open, disconnects a power supply from said n-well allowing said n-well to float,
   wherein said switch is a third p-channel transistor with a source connected to said n-well, a drain connected to the power supply, and a gate connected to the output of a scan register.

27. The integrated circuit of claim 26, wherein the third p-channel transistor is located within said n-well.

28. The integrated circuit of claim 26, wherein the scan latch is part of a scan chain.

29. The integrated circuit of claim 28, wherein the outputs of the scan chain are set during manufacturing testing.

30. An integrated circuit, comprising:
   an n-well;
   a first p-channel transistor within said n-well, wherein said n-well forms the body of said first p-channel transistor;
   a second p-channel transistor formed in said n-well, wherein said n-well forms a body of said second p-channel transistor; and a switch, wherein said switch, when closed, connects a power supply to said n-well, and when open, disconnects a power supply from said n-well allowing said n-well to float, wherein said switch is a third p-channel transistor with a drain connected to said n-well, a source connected to the power supply, and a gate connected to the output of a scan register.

31. The integrated circuit of claim 30, wherein the third p-channel transistor is located within said n-well.

32. A method, comprising the steps of:
a) selecting an integrated circuit chip;
b) evaluating the chip with all n-wells fully connected to a power supply;
c) evaluating the chip with all n-wells floating;
d) saving a best configuration of the chip if the chip is acceptable with all n-wells fully connected, or with all n-wells floating, and jumping to step s);
e) testing the evaluations for acceptable p-well bias;
f) generating a population using randomization and linear estimation;
g) running a Genitor-style genetic algorithm on the population;
h) selecting two parent chromosomes from the population using tournament selection;
i) reproducing a child chromosome from the two parent chromosomes;
j) generating the child's floating n-walls by favoring the more fit parent in a HUX-style crossover;
k) setting the child's substrate bias to the average substrate bias of the parents;
l) mutating the child chromosome both randomly and based on the average of the two parents;
m) evaluating the resulting child chromosome;
n) saving the child configuration of the chip if the evaluation of the child is acceptable, and jumping to step s);
o) updating the population if the maximum number of generations has not been reached, and jumping to step g),
p) saving the child configuration of the chip if the maximum number of genetic algorithms have been run, and jumping to step s);
q) re-estimating the biasing on the child chromosome;
r) updating the population, and jumping to step g); and
s) if more chips are available, selecting a new chip, and repeating steps b) through r), 33. A method, as recited in claim 32, further comprising the steps of:
t) reading the configuration; and
u) setting a scan chain on each chip, using the best configuration.

* * * * *

UNITED STATES PATENT AND TRADEMARK OFFICE
CERTIFICATE OF CORRECTION

PATENT NO. : 6,858,897 B2 Page 1 of 1
APPLICATION NO. : 10/427623
DATED : February 22, 2005
INVENTOR(S) : Thomas W. Chen It is certified that error appears in the above-identified patent and that said Letters Patent is hereby corrected as shown below:

IN THE CLAIMS

Column 6, line 46, delete "closeed" and insert therefor --closed--

Column 8, line 11, delete "scan" and insert therefor --shift--

Column 8, line 51, delete "source" and insert therefor --drain--

Column 8, line 51, delete "a drain" and insert therefor --a source--

Column 9, line 8, delete "scan" and insert therefor --shift--

Signed and Sealed this

Nineteenth Day of June, 2007

JON W. DUDAS
*Director of the United States Patent and Trademark Office*